Figure 1:
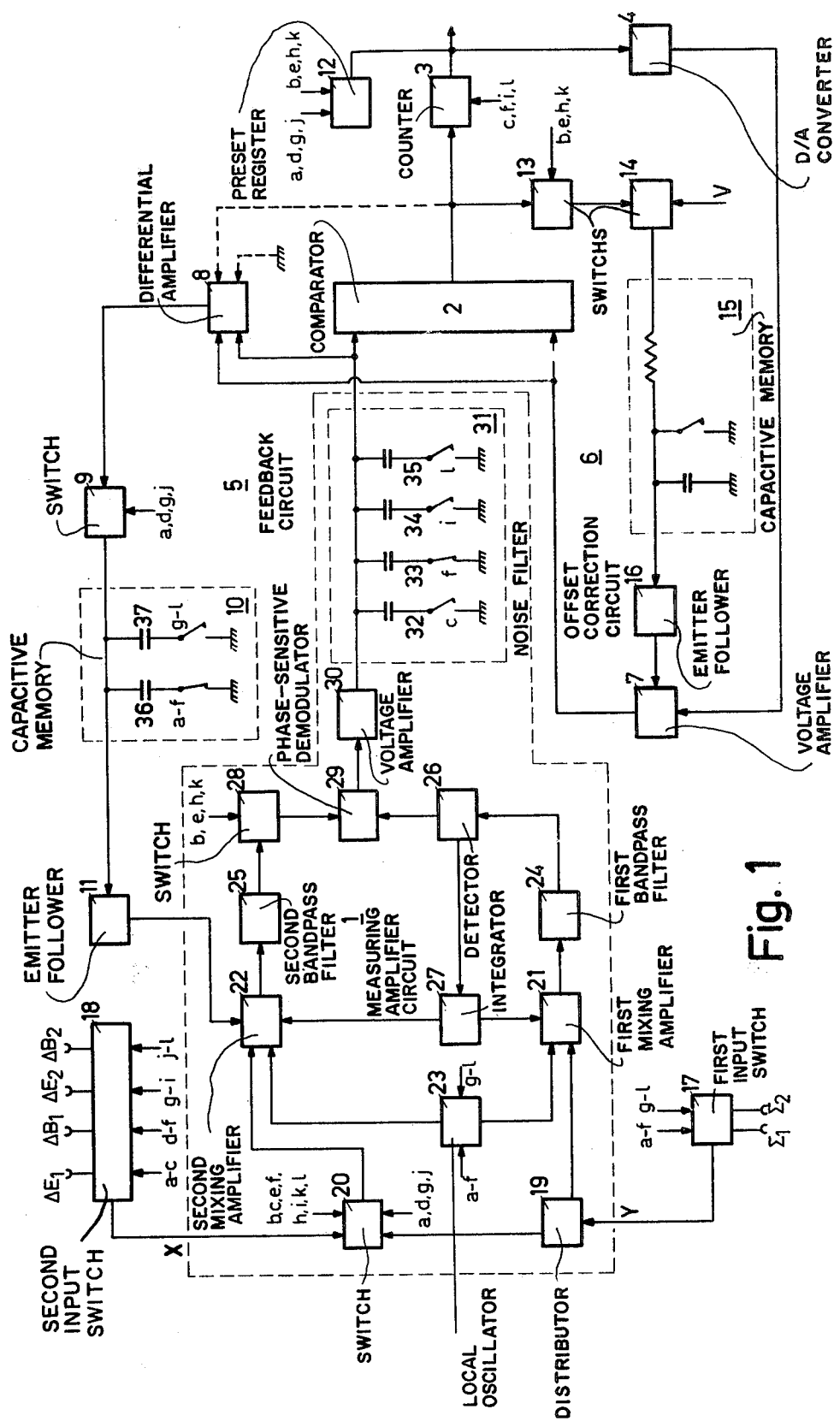

United States Patent [19]

Tammes et al.

[11] 4,143,361
[45] Mar. 6, 1979

[54] ANALOG-TO-DIGITAL CONVERTER WITH GAIN CORRECTION AND OFFSET CORRECTION

[75] Inventors: Jan B. Tammes, Borne; Marinus Toebes, Overdinkel, both of Netherlands

[73] Assignee: Hollandse Signaalapparaten B.V., Hengelo, Netherlands

[21] Appl. No.: 732,359

[22] Filed: Oct. 14, 1976

[30] Foreign Application Priority Data

Nov. 4, 1975 [NL] Netherlands ............................ 7512886

[51] Int. Cl.$^2$ ............................................. H03K 13/02
[52] U.S. Cl. ........................ 340/347 CC; 340/347 AD; 340/347 M; 325/326
[58] Field of Search ..................... 325/326, 400, 407; 340/347 M, 347 CC

[56] References Cited

U.S. PATENT DOCUMENTS

| | | |
|---|---|---|
| 3,530,458 | 9/1970 | Willard et al. .............. 340/347 CC |
| 3,646,448 | 2/1972 | Harmon et al. ................... 325/326 |
| 3,685,048 | 8/1972 | Pincus ......................... 340/347 CC |
| 3,958,236 | 5/1976 | Kelly ............................ 340/347 NT |

OTHER PUBLICATIONS

Schmid, Electronic analog/digital conversions, Van Nostrand Reinhold Co., 1970, pp. 387–389.

*Primary Examiner*—Thomas J. Sloyan
*Attorney, Agent, or Firm*—Thomas A. Briody; Steven R. Biren

[57] ABSTRACT

Analog-to-digital converter, comprises a measuring amplifier circuit, a comparator, a counter, a digital-to-analog converter, a feedback circuit and an offset correction circuit, and is operative in three modes; one mode for adjusting the gain factor of the measuring amplifier circuit by means of the feedback circuit, one mode for offset correction of this measuring amplifier circuit by means of the offset correction circuit and one mode for measuring a supplied voltage for conversion into a digital value.

6 Claims, 8 Drawing Figures

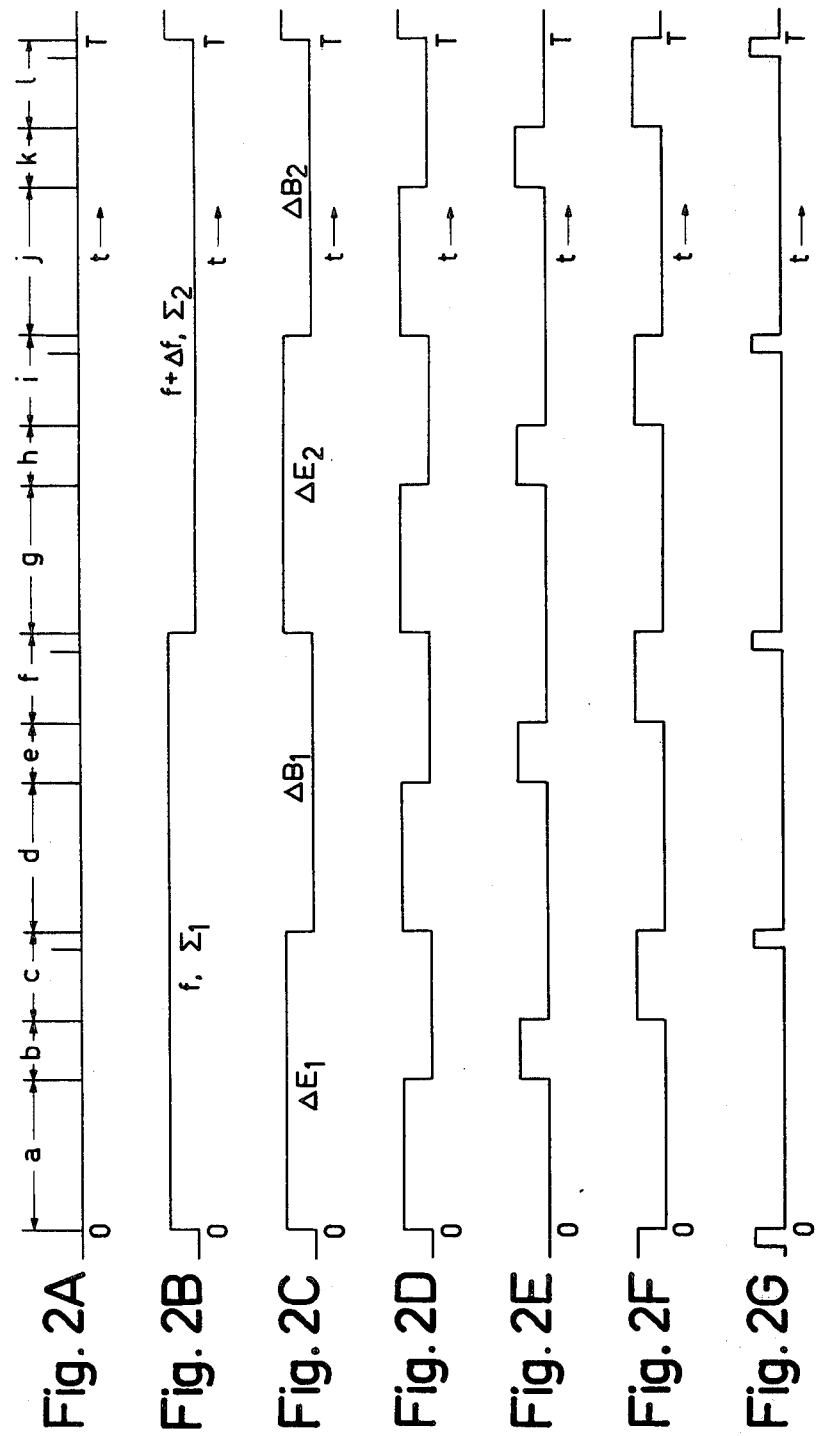

ANALOG-TO-DIGITAL CONVERTER WITH GAIN CORRECTION AND OFFSET CORRECTION

The invention relates to an analog-to-digital converter, comprising a measuring amplifier circuit, a comparator, a counter and a digital-to-analog converter, which are interconnected in the given order only during the mode in which a measuring voltage supplied to the measuring amplifier circuit is converted into digital form, while the comparator is fed with a voltage originating from the digital-to-analog converter for comparison with the output voltage of the measuring amplifier circuit.

Analog-to-digital converters of the above type are widely known. For reliable operation, these a/d converters must be tested and readjusted to the set specifications at regular intervals; however, this is impracticable if the a/d converters are situated in inaccessible installations, such as space capsules.

It is therefore an object of the present invention to provide a solution to the above problem by conducting the required tests and adjustments fully automatically.

According to the invention, the analog-to-digital converter of the above type comprises:

(a) a feedback circuit using an error voltage resulting from the measuring amplifier circuit and the d/a converter outputs, during a second mode preceding the aforementioned mode, in order to tune the measuring amplifier circuit, receiving a reference voltage as a measuring voltage, to the digital-to-analog converter, preset to a first digital value only during this second mode;

(b) an offset correction circuit using an error voltage from the comparator connected to the measuring amplifier circuit during a third mode between the two aforementioned modes, in order to align a comparator input voltage, originating from the digital-to-analog converter preset to a second digital value, with the output of the measuring amplifier circuit having an input turned off during the third mode.

The invention will be further described with reference to the accompanying drawings, of which:

FIG. 1 illustrates a diagram of an embodiment of an analog-to-digital converter according to the invention; and FIGS. 2A–2G represent timing diagrams of a combined test and measuring program for bringing and keeping a geosynchronous satellite in a desired attitude, the satellite incorporating an analog-to-digital converter according to the invention.

In the diagram of FIG. 1 the analog-to-digital converter according to the invention comprises a measuring amplifier circuit 1, a comparator 2, a counter 3 and a digital-to-analog converter 4, with the addition of a feedback circuit 5 and an offset correction circuit 6. These components of the a/d converter will be discussed in succession.

The measuring voltage to be converted into digital form is applied to input X of the measuring amplifier circuit 1, producing an output voltage for the comparator 2. In addition to this output voltage, the comparator 2 receives a reference voltage obtained from a circuit including the counter 3, the d/a converter 4 and a voltage amplifier 7 connected in series in the given sequence; the counter 3 is connected to the comparator 2, which generates a polarity-dependent error voltage as an output voltage. The counter 3 is of the type which counts up or down — depending on the polarity of the error voltage to be applied — until the digital value corresponding with the analog measuring voltage is obtained.

To assure good reproducibility of the measurement results, due care must be exercised in tuning the a/d converter. Good reproducibility of measurements with this a/d converter results from a correct adjustment of this converter with respect to both its gain factor and its offset voltage; the adjustment thereof is carried out collectively. As regards the tuning of the gain factor it may be remarked that — as a rule — the voltage range of the measuring amplifier circuit 1 and that of the voltage amplifier 7 driven by the d/a converter 4 are not matched to each other. This implies that an input voltage of the measuring amplifier circuit 1 of a given relative value, with respect to the voltage range of this circuit, and an input voltage of the d/a converter 4 of the same relative value, but with respect to the voltage range of this converter, would yield unequal input voltages for the comparator 2. By adjusting the gain factor of the measuring amplifier circuit on the one hand and — in the presence of an offset output voltage of circuit 1 — by allowing the voltage amplifier 7 to generate a correction voltage on the other hand, it is possible, in the given instance, to provide the comparator 2 with equal input voltages. The generation of the correction voltage means in fact that the zero level of the reference voltage, supplied by the voltage amplifier 7 to the comparator 2, is adapted to the level of the offset output voltage of circuit 1. Adjustment of the gain factor mentioned above requires the use of feedback circuit 5, while generation of the correction voltage is done by means of the offset correction circuit 6.

A reference voltage, obtained via input Y, is employed to tune the gain factor of measuring amplifier circuit 1. A corresponding voltage in digital form from a preset register 12 is applied to the d/a converter 4; it will be understood that the counter 3 is turned off. If the output voltages of circuit 1 and amplifier 7 differ, the gain factor of circuit 1 must be adjusted. For this purpose the feedback circuit 5 comprises at least a differential amplifier 8 and a switch 9, connected in series in the given sequence. In the preferred embodiment of an analog-to-digital converter according to the invention the differential amplifier 8 receives the two input voltages intended for the comparator 2. However, it is also possible to impress the comparator output voltage on one input of the differential amplifier 8 and to connect the other input to ground. In such a case, the output voltage of the differential amplifier 8 functions as an error voltage for the tuning of the gain factor of circuit 1.

The tuning of the gain factor continues until the output voltage of circuit 1 equals that of amplifier 7. In the embodiment here described, a fixed time of ample and therefore noncritcal measure is allocated for that purpose.

Since the error voltage produced for the tuning of the gain factor is to be available also during the conversion of a measuring voltage into digital form to maintain the setting obtained for circuit 1, it is desired to store this error voltage in a storage circuit. The feedback circuit 5 contains a capacitive memory 10 and an emitter follower 11 driven by memory 10; the output voltage of the emitter follower 11 is used to tune and maintain the setting of circuit 1 with respect to its gain factor.

The offset correction circuit 6 produces the abovementioned correction voltage in order to bring the zero level of the reference voltage for the comparator 2 to the offset voltage level produced by the measuring amplifier circuit 1. During the time available for that purpose the counter 3 is turned off and, instead, the register 12 supplies the d/a converter 4 with a digital voltage of a fixed value. This voltage corresponds half the value of the digital voltage range of this converter, generating a current of $+\frac{1}{2}$ I. Furthermore, the offset correction circuit 6 comprises two switches, 13 and 14, a capacitive memory 15 and an emitter follower 16, which are connected in series in the given sequence. In the period the zero level of the reference voltage is set to the offset voltage level, and switch 13 is in the conducting position. At the start of this period the memory 15 is momentarily reset by a switch in the storage circuit. The memory 15 is thereafter charged by means of voltage source V; this causes a current (I offset) to flow from the emitter follower 16 to the voltage amplifier 7 resulting in a decrease of the current amplifier 7 from $+\frac{1}{2}$ I to about zero. The input voltage for the comparator will decrease as well. This process continues until the two input voltages for comparator 2 have attained an equal value. In consequence of this, switch 14 is turned off by comparator 2, and the memory 15 has obtained its correct setting.

In the absence of offsets in the measuring amplifier circuit 1, the voltage supply from source V to the memory 15 may be expected to turn off at the instant the emitter follower 16, driven by the memory 15, draws a current I offset of exactly $-\frac{1}{2}$ I, where I is the maximum current delivered by the d/a converter 4. The digital-to-analog converter 4 produces an output current O and I after being supplid with the digital inputs (0, . . . ,0) and (1, . . . ,1) respectively. Consequently, the current in voltage amplifier 7 will be $-\frac{1}{2}$ I and $+\frac{1}{2}$ I respectively (in the absence of offset in the measuring amplifier 1). With a feedback resistance R inserted in the voltage amplifier 7, a voltage of $-\frac{1}{2}$ IR and $\frac{1}{2}$ IR respectively is then impressed across this amplifier, establishing the range of voltage amplifier 7 between $-\frac{1}{2}$ IR and $+\frac{1}{2}$ IR.

A correct setting of the a/d converter with respect to the gain factor and the offset voltage is obtained through iterative tuning of the a/d converter by means of the feedback circuit 5 and the offset correction circuit 6.

The embodiment of an a/d converter here described is particularly suitable for use in a measuring system of a geosynchronous satellite which is to be positioned at a given fixed point in space with respect to the earth's surface. In this process the satellite position, which also involves the tilt of the satellite, is continuously determined and, if necessary, corrected.

The satellite, as well as the two ground stations, is equipped with a C.W. radar system. The radar system of the satellite is provided with two monopulse antennas, which are alternately connected by a switch to the radar detection part in the satellite. These antennas are attached to the satellite capsule in such a way that, when the satellite assumes its correct spatial position with respect to the two ground stations, the center axis of each antenna points exactly in the direction of the appurtenant ground station. If this is not so, the radar detection part generates angular error voltages $\Delta E$ and/or $\Delta B$, which may be subdivided into voltages $\Delta E_1$ and/or $\Delta B_1$, determined with respect to one ground station, and into voltages $\Delta E_2$ and/or $\Delta B_2$, determined with respect to the other ground station. These voltages are transmitted in digital form to the ground stations, where a computer obtains steering data for the satellite, which receives this data to acquire its attitude.

The embodiment of an a/d converter preferred for such a satellite should thus be suitable for the conversion of a series of angular error voltages into digital values, the error voltages being applied as measuring voltages to the a/d converter.

For such an application of an a/d converter the facility of tuning the gain factor and determining the appropriate correction voltage is incorporated in the digitzation program of the a/d converter. This proceeds in the sequence given below.

The tuning of the gain factor of circuit 1 is invariably performed by means of the sum signal ($\Sigma_1$ or $\Sigma_2$), which is available together with the angular error voltages $\Delta E_1$, $\Delta B_1$ or $\Delta E_2$, $\Delta B_2$ to be converted into digital values. Hence, one complete cycle for the conversion of all angular error voltages into digital form comprises the following phases:

a. tuning of the gain factor in the presence of the sum signal $\Sigma_1$;

b. determination of the correction voltage;

c. digital determination of the angular error voltage $\Delta E_1$;

d. tuning of the gain factor in the presence of the sum signal $\Sigma_1$, see also a.;

e. determination of the correction voltage of the a/d converter, see also b.;

f. digital determination of the angular error voltage $\Delta B_1$;

g. tuning of the gain factor in the presence of the sum signal $\Sigma_2$;

h. determination of the correction voltage of the a/d converter, see also b.;

i. digital determination of the angular error voltage $\Delta E_2$;

j. tuning of the gain factor in the presence of the sum signal $\Sigma_2$; see also g.;

k. determination of the correction voltage of the a/d converter, see also b.;

l. digital determination of the angular error voltage $\Delta B_2$.

The phase designation also gives the control signal required for a given phase.

The way in which the angular error voltages are obtained in digital form will now be described with reference to FIGS. 1 and 2.

For the conversion of the angular error voltages into digital form the a/d converter shown in FIG. 1 is provided with a first and a second input switch 17 and 18 respectively, while the measuring amplifier circuit 1 incorporates a distributor 19, a switch 20; a first and a second mixing amplifier 21 and 22 respectively, a local oscillator 23, a first and a second bandpass filter 24 and 25 respectively, a detector 26, an integrator 27, a switch 28, a phase-sensitive demodulator 29, a voltage amplifier 30 and a noise filter 31. The first and the second input switches 17 and 18 are connected respectively to inputs Y and X of circuit 1.

The first input switch 17 and the distributor 19 pass the sum signals $\Sigma_1$ and $\Sigma_2$ in turn to the first mixing amplifier 21 through the application of control signals a–f and g–l respectively (see FIGS. 2A and 2B). $\Sigma_1$ and $\Sigma_2$ of frequencies f and f + $\Delta$f, respectively, are produced by the radar detection part. By the first group of control signals a–f is meant the series of signals a, b, c, d, e and f, which are generated in a timing unit not shown here; the second group of control signals is interpreted similarly.

The first mixing amplifier 21 transforms the high-frequency $\Sigma_1$ and $\Sigma_2$ signals to intermediate-frequency signals with the aid of the local oscillator 23. This oscillator is of a duplex design, capable of generating signals of frequencies $f_0$ and $f_0 + \Delta f$ alternately. These frequencies thus show the same difference $\Delta f$ as the high frequencies of the sum signals $\Sigma_1$ and $\Sigma_2$. The alternate transmissions of the above-mentioned output signals of the local oscillator 23 proceed at such a pace that, during the time the first input switch 17 passes the sum signal $\Sigma_1$ of the lower frequency f, the local oscillator 23 is operating at the lower frequency $f_0$ as well (phases a–f, see FIGS. 2A and 2B), whereas during the time the first input switch 17 passes the other sum signal $\Sigma_2$ of the higher frequency $f + \Delta f$ the local oscillator is operating at the higher frequency $f_0 + \Delta f$ (see FIGS. 2A and 2B). In this way the output signal of the first mixing amplifier 21 is always of the same frequency $f-f_0$.

Since it is possible, however, that even with the first input switch 17 in the "off" position, the sum signal still penetrates as far as the first mixing amplifier 21, the first bandpass filter 24 is connected to the output of this amplifier; this bandpass filter has a center frequency of $f-f_0$ and has a very narrow bandwidth. Thus, despite signal penetration as stated above, intermediate frequency signals of frequency $f-f_0 \pm \Delta f$ are not passed and accordingly do not adversely affect the remaining measuring process. The signal passing through the bandpass filter 24 is intended to function as a reference signal for the phase-sensitive demodulator 29. Such a signal however requires a constant amplitude; for this reason an AGC circuit is included in circuit 1. The AGC circuit comprises the following units: detector 26, integrator 27, first mixing amplifier 21 and first bandpass filter 24. The output signal of the bandpass filter 24 is supplied to the detector 26, producing two output signals: one of these is a unipolar signal applied to the integrator 27 to tune the amplifying circuit of the mixing amplifier 21 such that the output signal amplitude of this amplifier remains constant; the other signal is intended for the phase-sensitive demodulator 29 and is thus a bipolar output signal of constant amplitude.

The angular error voltages $\Delta E_1$, $\Delta B_1$, $\Delta E_2$ and $\Delta B_2$ from the two monopulse antennas pass through the second input switch 18 in succession with the aid of control signals a–c, d–f, g–i and j–l (see FIGS. 2A and 2C). These error voltages are applied to the second mixing amplifier 22 via switch 20. As in the case of the high-frequency sum signals $\Sigma_1$ and $\Sigma_2$ in the first mixing amplifier 21, the high-frequency angular error voltages $\Delta E_1$, $\Delta B_1$, $\Delta E_2$ and $\Delta B_2$ are transformed to the intermediate frequency range by means of local oscillator 23. In this process, signals $\Delta E_1$ and $\Delta B_1$ are mixed in turn with the oscillator signal of frequency $f_0$ through the application of control signals a–c and d–f respectively. This is followed by the mixing of signals $\Delta E_2$ and $\Delta B_2$ with the oscillator signal of frequency $f_0 + \Delta f$ through control signals g–i and j–l respectively (see FIGS. 2A, 2B and 2C).

Since extreme angular error voltages introduce unnecessary phase shifts, which are undesirable in view of the subsequent phase detection of these voltages, the second mixing amplifier 22 — as in the case of the first mixing amplifier 21 — is tuned by the integrator 27 in the AGC circuit.

The output signal of the second mixing amplifier 22 is applied to the phase-sensitive demodulator 29 via the filter 25, which is identical to filter 24, and via switch 28. The demodulator 29 produces an output signal $A \cos \Phi$ when the reference signal $A \sin \omega t$ is provided from the detector 26 and the angular error voltage $C \sin (\omega t + \Phi)$, functioning as measuring signal, is provided from the switch 28.

The output signal of the phase-sensitive demodulator 29 is applied to the noise filter 31 via the voltage amplifier 30, in order to obtain a filtered signal for comparator 2.

During phases c, f, i and l the counter 3 builds up the digital voltage from the output signal of the noise filter 31 (see FIGS. 2A–2F). This digital voltage is subject to changes until the reference voltage, obtained via the voltage amplifier 7 from the d/a converter 4 driven by counter 3, is equal to the analog measuring voltage for comparator 2. Hence, only the digital voltages available at the end of phases c, f, i and l are usable to produce steering data for the satellite (see FIG. 2G).

It should be noted that in the above preferred embodiment of an a/d converter the output of the radar detection part, delivering the sum signals $\Sigma_1$ and $\Sigma_2$ during the tuning of the gain factor of circuit 1 — i.e. during phases a, d, g and j (see FIGS. 2A and 2D) — may not be loaded more than 10%. In consequence of this, the input switch 17 receives an input voltage which is only 10% of the total input range of circuit 1, causing the input of the d/a converter to be limited to a digital value which is only 10% of the converter's full digital range. This digital value is supplied by the preset register 12. It will be understood that counter 3 is turned off under these conditions.

If the output voltages then obtained from circuit 1 and amplifier 7 are different, the gain factor must be adapted. In the preferred embodiment this means that the gain factor of the second mixing amplifier 22 is adjusted by feeding the two mixing amplifiers 21 and 22 with the same signal during phases a, d, g and j (see FIGS. 2A and 2D). To this effect, the sum signals $\Sigma_1$ and $\Sigma_2$, as obtained from input switch 17 and applied to the distributor 19, are fed to both the first and the second mixing amplifiers 21 and 22 during phases a, d and g, j respectively. Switch 20 connects the second mixing amplifier 22 to the distributor 19, instead of to the second input switch 18, during phases a, d, g and j. In this case, the error voltage for the tuning of the gain factor of the second mixing amplifier 22 is obtained from the signals supplied to the comparator 2 with the noise filter 31 disconnected from ground. During phases b, e, h and k, for the generation of the correction voltage in the presence of an offset voltage in circuit 1 (see FIGS. 2A and 2E) the phase-sensitive demodulator 29 remains connected to the detector 26 in order to obtain a reference signal. However during this period the connection between the second bandpass filter 25 and the demodulator 29 is interrupted by switch 28, disconnecting the respective demodulator input from ground. Under this condition the switch 9 is open, while the noise filter 31 is disconnected from ground. Register 12 supplies the d/a converter 4 with a digital voltage, amounting to half the digital range of this converter. This sets the zero level of the reference voltage for comparator 2 to the offset level by means of switches 13 and 14, the capacitive memory 15 and the emitter follower 16.

However, with the above embodiment of an a/d converter the following problem still arises: the RC time of the noise filter 31 is a factor 30 greater than the time in which the second input switch 18 passes an angular error voltage uninterruptedly, and — as will be explained — more than fifty times greater than the time such an error voltage is uninterruptedly applied to the phase-sensitive demodulator 29. In such a case, the rate of supply of the phase-detected error voltages, obtained in succession from various angular error voltages, to the noise filter 31 would be too high, preventing this filter from adjusting itself to the voltage applied and hence impeding the noise filtering process.

An advantageous and satisfactorily operating embodiment of an analogue-to-digital converter is obtained by incorporating for each of the angular error voltages $\Delta E_1$, $\Delta B_1$, $\Delta E_2$ and $\Delta B_2$ a separate switchable capacitive memory — 32, 33, 34 and 35, respectively — in the noise filter 31. A capacitive memory is to be turned on only during the time the respective angular error voltage is being applied to the phase-sensitive demodulator 29 (see FIGS. 2A and 2F). In this way each capacitive memory — 32, 33, 34 and 35 — acquires its setting after a number of cycles in which the phase-detected error voltage is periodically applied to each respective capacitive memory, and is capable of performing its filter function in the subsequent phases c, f, i and l, respectively.

An additional advantage of the switchable capacitive memories shown in the figure is that each capacitive memory needs only one switch which is inserted in the ground connection of the respective memory. The output signal of the noise filter 31 is then suitable for application to the comparator 2.

The above-mentioned problem, as to the RC time of a capacitive memory, also arises in memory 10. The latter memory therefore consists of two identical capacitive memories, 36 and 37, each being active for half a measuring cycle, viz. during phases a–f and g–l, respectively (see FIG. 2A). Memories 36 and 37 are identical to those of noise filter 31. If during the first half of a complete measuring cycle (phases a–f) the memory 36 is active, this memory is to be loaded during phases a and d with the aid of the angular error voltage and switch 9 then in the closed position. During the remaining phases b, c, e and f of the half measuring cycle the emitter follower 11 is driven by the set capacitive memory 36, when switch 9 is open. Similarly, memory 37 is activated during the other half of the same measuring cycle.

What we claim is:

1. An analog-to-digital converter having three modes of operation and comprising a measuring amplifier circuit, a comparator, a counter and a digital-to-analog converter, interconnected in the given order, which digital-to-analog converter feeds the comparator with a voltage for comparison with the output voltage of the measuring amplifier circuit, to cause an analog input voltage applied to the measuring amplifier circuit to be converted into a digital signal delivered by the counter during said first mode, the analog-to-digital converter comprising:

(a) a preset register;
   (b) a feedback circuit for recalibrating the gain of the measuring amplifier circuit with an error voltage generated from the output of the measuring amplifier circuit, supplied at its input with a reference voltage, and the digital-to-analog converter, supplied at its input with a first digital signal from the preset register during said second mode with the counter deactivated, said digital signal being representative of said reference voltage;
   (c) an offset correction circuit for offsetting the comparator, which comparator is supplied with the output signal from the measuring amplifier circuit while having its input turned off, and with the output signal from the digital-to-analog converter while receiving the digital signal zero from the preset register in said third mode with the counter deactivated, the measuring amplifier circuit comprising a first and a second mixing amplifier, an integrator, a detector and a phase-sensitive demodulator, which demodulator is fed with a first signal voltage via the second mixing amplifier driven by the feedback circuit and with a second signal voltage via the first mixing amplifier and the detector, while both the first and the second mixing amplifiers are set with the integrator connected to the detector.

2. An analog-to-digital converter having three modes of operation and comprising a measuring amplifier circuit, a comparator, a counter and a digital-to-analog converter, interconnected in the given order, which digital-to-analog converter feeds the comparator with a voltage for comparison with the output voltage of the measuring amplifier circuit, to cause an analog input voltage applied to the measuring amplifier circuit to be converted into a digital signal delivered by the counter during said first mode, the analog-to-digital converter comprising:

(a) a preset register;
   (b) a feedback circuit for recalibrating the gain of the measuring amplifier circuit with an error voltage generated from the output of the measuring amplifier circuit, supplied at its input with a reference voltage, and the digital-to-analog converter, supplied at its input with a first digital signal from the preset register during said second mode with the counter deactivated, said digital signal being representative of said reference voltage;
   (c) an offset correction circuit for offsetting the comparator, which comparator is supplied with the output signal from the measuring amplifier circuit while having its input turned off, and with the output signal from the digital-to-analog converter while receiving the digital signal zero from the preset register in said third mode with the counter deactivated, the measuring amplifier circuit comprising a first and a second mixing amplifier, an integrator, a detector, a first switching means, signal distribution means for supplying the second signal voltage applied to the first mixing amplifier also to the second mixing amplifier instead of the first signal voltage during the second mode and a phase-sensitive demodulator which demodulator is fed with a first signal voltage via the second mixing amplifier driven by the feedback circuit and with a second signal voltage via the first mixing amplifier and the detector, while both the first and the second mixing amplifiers are set with the integrator connected to the detector.

3. An analog-to-digital converter as claimed in claim 2, wherein the measuring amplifier circuit comprises a third switching means for connecting a number n of signal generators in turn to the first mixing amplifier, and wherein the measuring amplifier circuit further comprises a fourth switching means for connecting a number 2n of signal generators in turn to the second mixing amplifier, the active period in which two signal generators connected to the second mixing amplifier are operating in succession coinciding with the active period of one of the signal generators connected to the first mixing amplifier.

4. An analog-to-digital converter as claimed in claim 3, wherein each period in which a signal generator is connected to the first mixing amplifier comprises said three modes.

5. An analog-to-digital converter as claimed in claim 4, wherein the measuring amplifier circuit comprises a storage circuit of 2n capacitive memories, which storage circuit is connected to the phase-sensitive demodulator and which capacitive memories are activated in turn and only during the first modes of the analog-to-digital converter.

6. An analog-to-digital converter as claimed in claim 5, wherein a switch is provided in each ground connection of the capacitive memories.

* * * * *